US008969950B2

(12) United States Patent
Pan

(10) Patent No.: US 8,969,950 B2
(45) Date of Patent: Mar. 3, 2015

(54) INTEGRATED MOSFET-SCHOTTKY DIODE DEVICE WITH REDUCED SOURCE AND BODY KELVIN CONTACT IMPEDANCE AND BREAKDOWN VOLTAGE

(75) Inventor: Ji Pan, San Jose, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 383 days.

(21) Appl. No.: 13/306,067

(22) Filed: Nov. 29, 2011

(65) Prior Publication Data
US 2012/0068262 A1 Mar. 22, 2012

Related U.S. Application Data

(63) Continuation-in-part of application No. 12/317,629, filed on Dec. 23, 2008, now Pat. No. 8,362,552.

(51) Int. Cl.
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 29/861 | (2006.01) |
| H01L 29/08 | (2006.01) |
| H01L 29/66 | (2006.01) |
| H01L 29/78 | (2006.01) |
| H01L 29/872 | (2006.01) |

(Continued)

(52) U.S. Cl.
CPC .......... *H01L 29/8611* (2013.01); *H01L 29/086* (2013.01); *H01L 29/0878* (2013.01); *H01L 29/66128* (2013.01); *H01L 29/66143* (2013.01); *H01L 29/66719* (2013.01); *H01L 29/66727* (2013.01); *H01L 29/66734* (2013.01); *H01L 29/7806* (2013.01); *H01L 29/7811* (2013.01); *H01L 29/7813* (2013.01); *H01L 29/872* (2013.01); *H01L 29/0623* (2013.01); *H01L 29/1095* (2013.01); *H01L 29/41766* (2013.01); *H01L 29/4236* (2013.01); *H01L 29/47* (2013.01)
USPC .................................. 257/330; 257/E29.013

(58) Field of Classification Search
CPC .................................................. H01L 29/7813
USPC .......................................... 257/330, E29.013
See application file for complete search history.

(56) References Cited

U.S. PATENT DOCUMENTS

| 6,110,799 A * | 8/2000 | Huang .......................... 438/430 |
| 7,230,297 B2 * | 6/2007 | Ono et al. ...................... 257/330 |

(Continued)

*Primary Examiner* — Howard Weiss
(74) *Attorney, Agent, or Firm* — Chein-Hwa Tsao; C H Emily LLC

(57) ABSTRACT

A MOSFET device and fabrication method are disclosed. The MOSFET has a drain in chip plane with an epitaxial layer overlay atop. The MOSFET further comprises: a Kelvin-contact body and an embedded Kelvin-contact source; a trench gate extending into the epitaxial layer; a lower contact trench extending through the Kelvin-contact source and at least part of the Kelvin-contact body defining respectively a vertical source-contact surface and a vertical body-contact surface; a patterned dielectric layer atop the Kelvin-contact source and the trench gate; a patterned top metal layer. As a result: a planar ledge is formed atop the Kelvin-contact source; the MOSFET device exhibits a lowered body Kelvin contact impedance and, owing to the presence of the planar ledge, a source Kelvin contact impedance that is lower than an otherwise MOSFET device without the planar ledge; and an integral parallel Schottky diode is also formed.

10 Claims, 14 Drawing Sheets

(51) Int. Cl.
*H01L 29/06* (2006.01)
*H01L 29/10* (2006.01)
*H01L 29/417* (2006.01)
*H01L 29/423* (2006.01)
*H01L 29/47* (2006.01)

(56) References Cited

U.S. PATENT DOCUMENTS 7,994,001 B1 * 8/2011 Hsu et al. .................. 438/237
2008/0246082 A1 * 10/2008 Hshieh ...................... 257/333

* cited by examiner

INTEGRATED MOSFET-SCHOTTKY DIODE DEVICE WITH REDUCED SOURCE AND BODY KELVIN CONTACT IMPEDANCE AND BREAKDOWN VOLTAGE

CROSS REFERENCE TO RELATED APPLICATIONS

This application is a Continuation-in-Part (CIP) of a commonly owned US application entitled "MOSFET device with reduced breakdown voltage", by Ji Pan and Anup Bhalla with application Ser. No. 12/317,629, filing date Dec. 23, 2008, now U.S. Pat. No. 8,362,552, Whose content is herein incorporated by reference for any and all purposes.

FIELD OF INVENTION

This invention relates generally to the field of semiconductor device structure. More specifically, the present invention is directed to device structure and associated manufacturing method to form an integrated MOSFET Device with certain device performance parameters.

BACKGROUND OF THE INVENTION

Modern semiconductor devices, such as Metal Oxide Semiconductor Field Effect Transistors (MOSFETs) are often high density devices with small feature sizes. For example, the wall-to-wall pitch size of some MOSFETs in use today is on the order of 1-2 microns. As device size decreases, the correspondingly reduced contact electrode area and thickness of gate oxide within the device typically result in an undesirable increase of its Kelvin contact impedance and reduction of its breakdown voltage. The problem is more pronounced in power MOSFET devices, which often conduct high current and demand high breakdown voltage.

BRIEF DESCRIPTION OF THE DRAWINGS

To describe numerous embodiments of the present invention, reference is made to the accompanying drawings. However, these drawings are not to be considered limitations in the scope of the invention, but are merely illustrative.

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

Figure 1A:
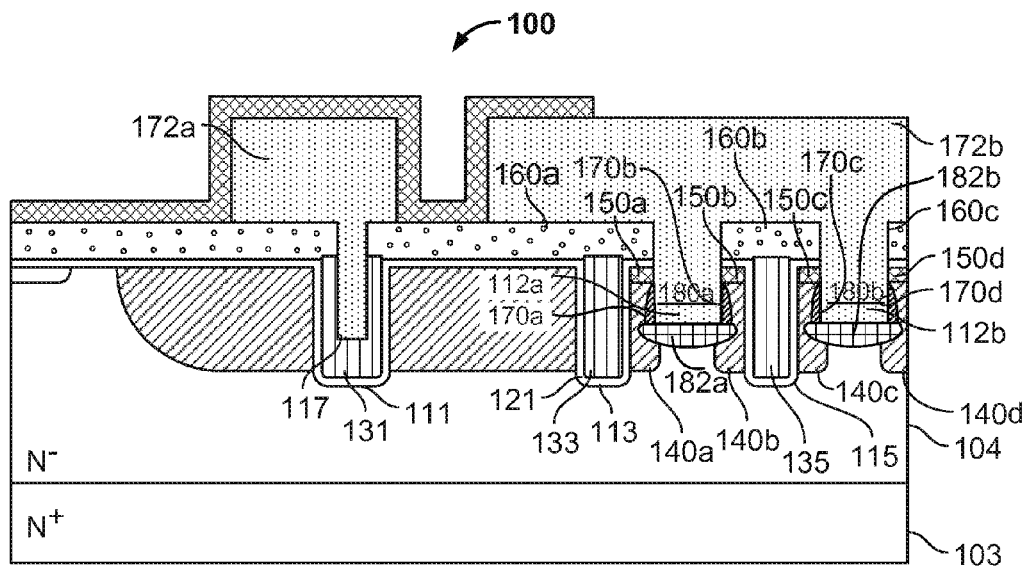
FIGS. 1A-1B, directly copied from application Ser. No. 12/317,629, are cross-sectional diagrams illustrating embodiments of double-diffused metal oxide semiconductor (DMOS) devices with reduced breakdown voltage.

FIG. 1A is a cross-sectional diagram illustrating an embodiment of a double-diffused metal oxide semiconductor (DMOS) device with reduced breakdown voltage. In this example, device 100 includes a drain that is formed on the back of an $N^+$-type semiconductor substrate 103. The drain region extends into an epitaxial (epi) layer 104 of $N^-$-type semiconductor that overlays substrate 103. Gate trenches such as 111, 113, and 115 are etched in epi layer 104. A gate oxide layer 121 is formed inside the gate trenches. Gates 131, 133 and 135 are disposed inside gate trenches 111, 113 and 115, respectively, and are insulated from the epi layer by the oxide layer. The gates are made of a conductive material such as polycrystalline silicon (poly) and the oxide layer is made of an insulating material such as thermal oxide. Specifically, gate trench 111 is located in a termination region disposed with a gate runner 131 for connection to gate contact metal. For that purpose gate runner trench 111 may be wider and deeper compared to active gate trenches 113 and 115. Furthermore, the spacing between the gate runner trench 111 from the active trench next to it, in this case trench 113, may be larger than the spacing between the active gate trenches 113 and 115.

Source regions 150a-d are embedded in body regions 140a-d, respectively. The source regions extend downward from the top surface of the body into the body itself. While body regions are implanted along side of all gate trenches, source regions are only implanted next to active gate trenches and not gate runner trenches. In the embodiment shown, gates such as 133 have a gate top surface that extends substantially above the top surface of the body where the source is embedded. Such a configuration guarantees the overlap of the gate and the source, allowing the source region to be shallower than the source region of a device with a recessed gate, and increases device efficiency and performance. The amount by which the gate poly top surface extends above the source-body junction may vary for different embodiments. In some embodiments, the gates of the device do not extend above the top surface of the source-body region.

During operation, the drain region and the body regions together act as a diode, referred to as the body diode. A dielectric material layer 160 is disposed over the gate to insulate the gate from source-body contact. The dielectric material forms insulating regions such as 160a-c on top of the gates as well as on top of the body and source regions. Appropriate dielectric materials include thermal oxide, low temperature oxide (LTO), boro-phospho-silicate glass (BPSG), etc.

A number of contact trenches 112a-b are formed between the active gate trenches near the source and body regions. These trenches are referred to as active region contact trenches since the trenches are adjacent to the device's active region that is formed by the source and body regions. For example, contact trench 112a extends through the source and the body, forming source regions 150a-b and body regions 140a-b adjacent to the trench. In contrast, trench 117, which is formed on top of gate runner 131, is not located next to an active region, and therefore is not an active region contact trench. Trench 117 is referred to as a gate contact trench or gate runner contact trench since a metal layer 172a connected to the gate signal is deposited within the trench. Gate signal is fed to active gates 133 and 135 through interconnections between trenches 111, 113 and 115 in the third dimension (not shown). Metal layer 172a is separated from metal layer 172b, which connects to source and body regions through contact trenches 112a-b to supply a power source. In the example shown, the active region contact trenches and gate contact trench have approximately the same depth.

In the example shown, regions such as 170a-d within the body and along the walls of the active region contact trench are heavily doped with P type material to form $P^+$-type regions referred to as body contact implants. The body contact implants are included to ensure that Ohmic contact is formed between the body and the source metal therefore the source and the body have the same potential.

A conductive material is disposed in contact trenches 112a-b as well as gate contact trench 117 to form contact electrodes. In the active region, the contact electrodes and the drain region form Schottky diodes that are in parallel with the body diode. The Schottky diodes reduce the body diode's forward voltage drop and minimize the stored charge, making the MOSFET more efficient. A single metal that is capable of simultaneously forming a Schottky contact to the $N^-$ drain and forming good Ohmic contact to the $P^+$ body and $N^+$ source is used to form electrodes 180a-b. Metals such as titanium (Ti), platinum (Pt), palladium (Pd), tungsten (W) or any other appropriate material may be used. In some embodiments, metal layer 172 is made of aluminum (Al) or made of a Ti/TiN/Al stack.

In conventional power MOSFET devices, the breakdown voltage of the Schottky diode formed between the contact electrode and the drain is typically as high as the breakdown voltage of the body diode. In such devices, before breakdown occurs, a large electric field may build up around the bottom of the gate and cause damage to the gate oxide. In device 100, the breakdown voltage of the device is reduced by implanting dopants having the same carrier type as the epitaxial layer below contact trenches 112a and 112b. The resulting epi enhancement portions (also referred to as breakdown voltage reducing implants) 182a and 182b have the same carrier type as the epitaxial layer but at a higher concentration. In this example, the carrier type of the epi is N-type (i.e., electrons are the majority carriers and holes are the minority carriers), and the epi enhancement portions are also N-type. In embodiments where the carrier type of the epi is P-type (i.e., electrons are the minority carriers and holes are the majority carriers), the epi enhancement implants are also P-type. The epi enhancement implants reduce the breakdown voltage of the Schottky diode formed between the contact electrode and the drain. Since the Schottky diode is in parallel with the body diode and has a lower breakdown voltage, the overall breakdown voltage of the device is reduced. In the event of a high electric field buildup, the Schottky diode breakdowns first and conducts current to dissipate the charges, thus preventing the electric field from causing damage to the gate oxide. The formation of the epi enhancement implants is discussed in greater detail below. The thickness and concentration of the epi enhancement implants depends on the desired breakdown voltage since thicker or more concentrated implants result in lower breakdown voltage. In one example, the breakdown voltage of the device is reduced from 38V to 22V with the inclusion of the epi enhancement portions.

Figure 1B:
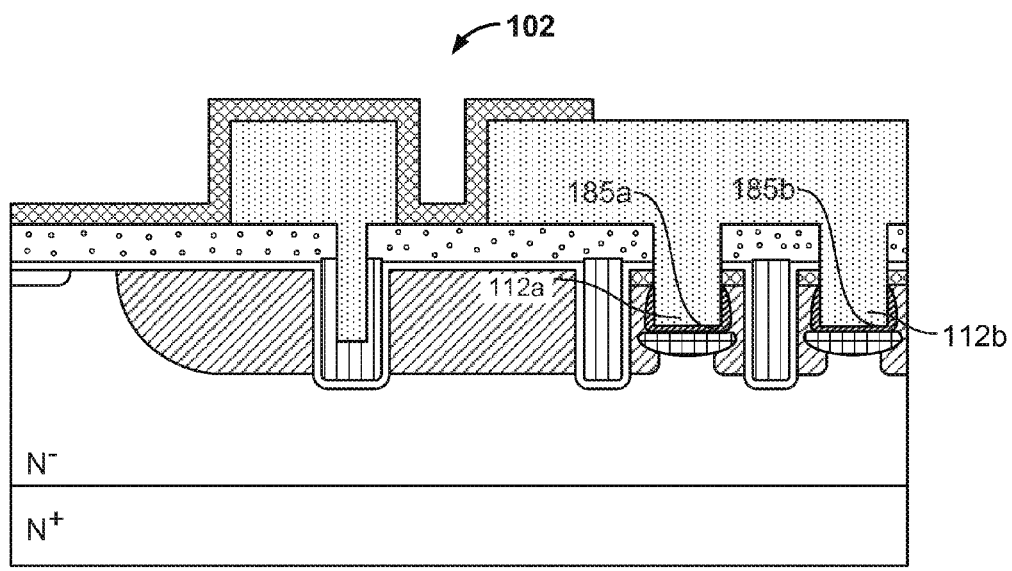

FIG. 1B is a cross-sectional diagram illustrating an embodiment of a DMOS device with reduced breakdown voltage. In this example, device 102 is similar to device 100, except that thin layers of P-material 185a and 185b are formed immediately below contact trenches 112a and 112b, respectively. Instead of forming Schottky diodes, low injection diodes are formed at the body/drain junctions below the bottoms of contact trenches 112a and 112b. These layers of P-material increase the forward voltage drop ($V_{fd}$) of the low injection diodes and reduce the leakage current, and are therefore referred to as the diode enhancement layers. As will be described in greater detail below, in some embodiments the diode enhancement layers are formed by the same processing steps that form the body contact implants. The dopant concentration of diode enhancement layer is much lower than that of body contact implant regions 170a-d such that at reversed bias the diode enhancement layer is completely depleted yet high enough that at forward bias it is not depleted. The thickness of the diode enhancement layers depends on the desired amount of low injection diode forward voltage as a thicker layer results in a higher forward voltage drop.

Similar to device 100, device 102 also includes implants with dopants having the same carrier type as the epitaxial layer. The resulting epi enhancement portions (also referred to as breakdown voltage reducing implants) 182a and 182b are formed below diode enhancement layers 185a and 185b, and have the same carrier type as the epitaxial layer but at a higher concentration to reduce the breakdown voltage of the low injection diodes thus preventing the electric field from causing damage to the gate oxide.

The embodiments shown above use N-type substrate (i.e., an N.sup.+silicon wafer with an N.sup.−epi layer grown on the wafer) as the drain of the device. In some embodiments, P-type substrate is used and the devices have N-type body contact implants and P-type epi enhancement layers.

Figure 2:
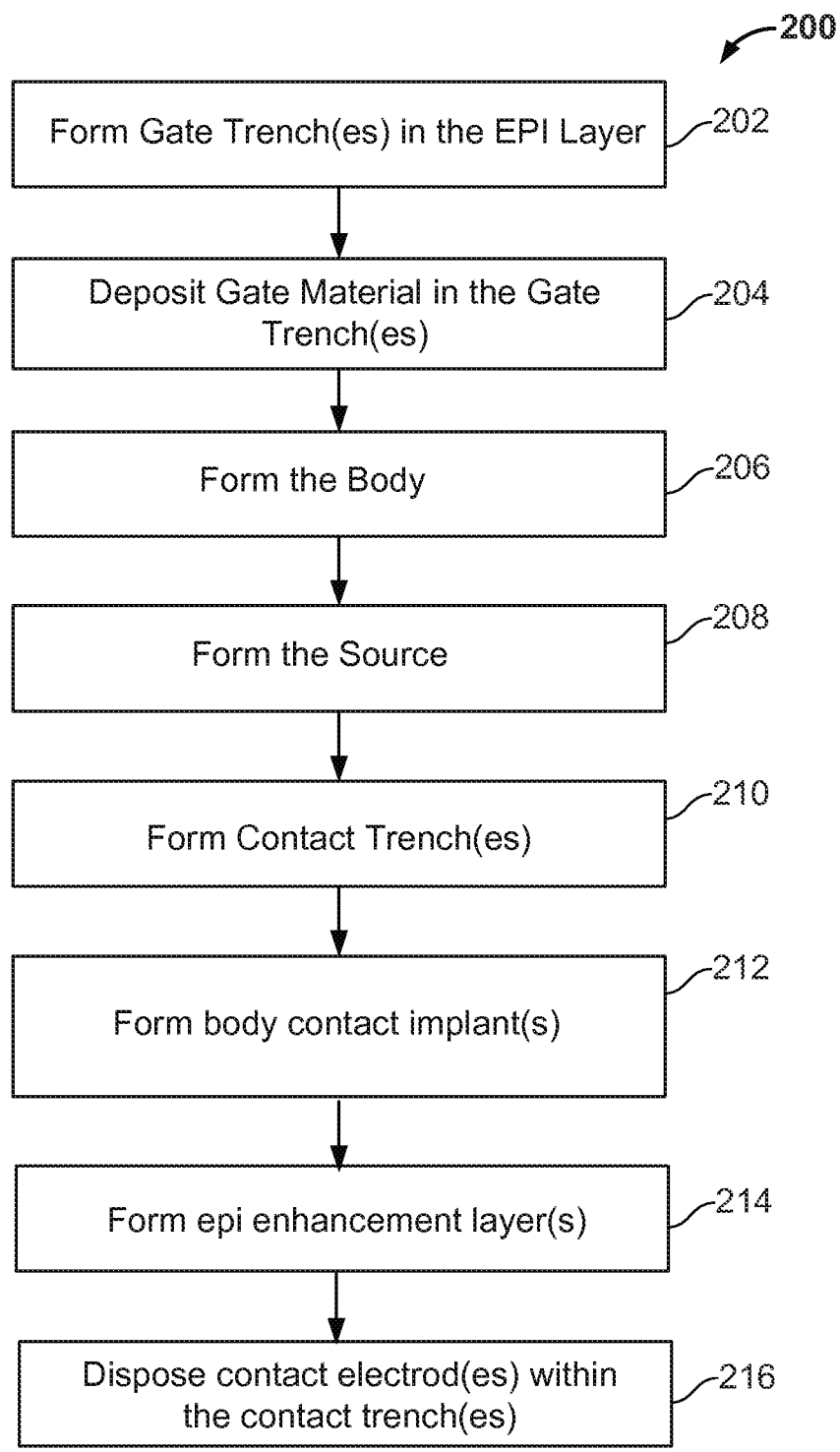
FIG. 2, directly copied from application Ser. No. 12/317,629, is a flowchart illustrating an embodiment of a fabrication process for constructing a DMOS device.

FIG. 2 is a flowchart illustrating an embodiment of a fabrication process for constructing a DMOS device. At 202, gate trenches are formed in the epi layer overlaying the semiconductor substrate. At 204, gate material is deposited in the gate trenches. At 206, the body is formed. At 208, the source is formed. At 210, contact trenches are formed. At 212, body contact implants are formed. At 214, epi enhancement layers are formed. At 216, contact electrodes are disposed within the contact trenches. Process 200 and its steps can be modified to produce different embodiments of MOS devices such as 100 and 102 shown above.

Figure 3A:
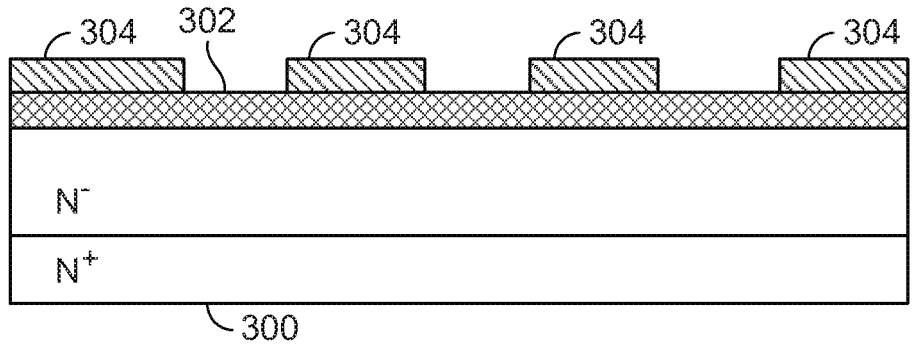
FIGS. 3A-3N, directly copied from application Ser. No. 12/317,629, are device cross-sectional views illustrating in detail an example partial fabrication process used for fabricating a MOSFET device.

FIGS. 3A-3S are device cross-sectional views illustrating in detail an example fabrication process used for fabricating a MOSFET device. FIGS. 3A-3J shows the formation of the gates. In FIG. 3A, a $SiO_2$ layer 302 is formed on N-type substrate 300 by deposition or thermal oxidation. The thickness of the silicon oxide ranges from 100 Å to 30000 Å in various embodiments. Other thicknesses can be used. The thickness is adjusted depending on the desired height of the gate. A photoresist layer 304 is spun on top of the oxide layer and patterned using a trench mask.

Figure 3B:
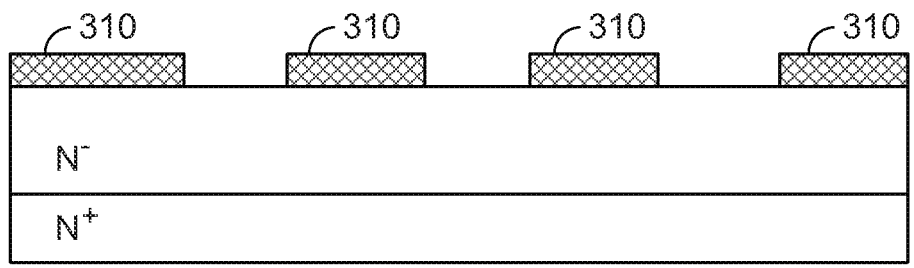
Figure 3C:
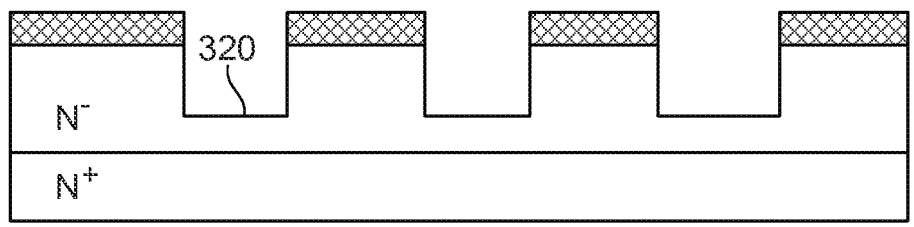
Figure 3D:
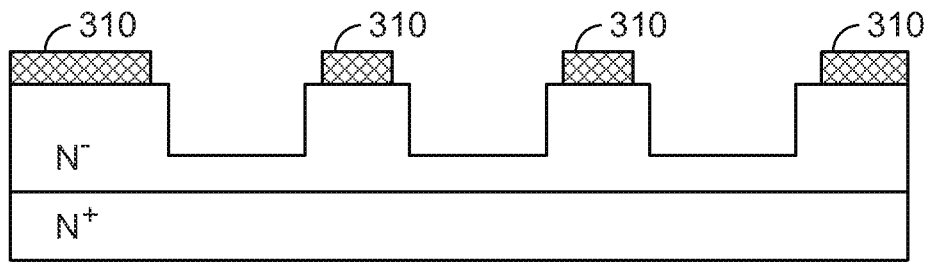

In FIG. 3B, $SiO_2$ in the exposed areas is removed, leaving a $SiO_2$ hard mask 310 for silicon etching. In FIG. 3C, the silicon is etched anisotropically, leaving trenches such as 320. The gate material is deposited in the trenches. Gates that are later formed within the trench have sides that are substantially perpendicular to the top surface of the substrate. In FIG. 3D, $SiO_2$ hard mask 310 is etched back by an appropriate amount so that the trench walls remain approximately aligned with the edge of the hard mask after later etching steps. SiO$_2$ is the mask material used in this embodiment because etching using a SiO$_2$ hard mask leaves relatively straight trench walls that mutually align with the sides of the mask. Other material may be used as appropriate. Certain other types of material traditionally used for hard mask etching, such as Si$_3$N$_4$, may leave the etched trench walls with a curvature that is less desirable for gate formation in the following steps.

Figure 3E:
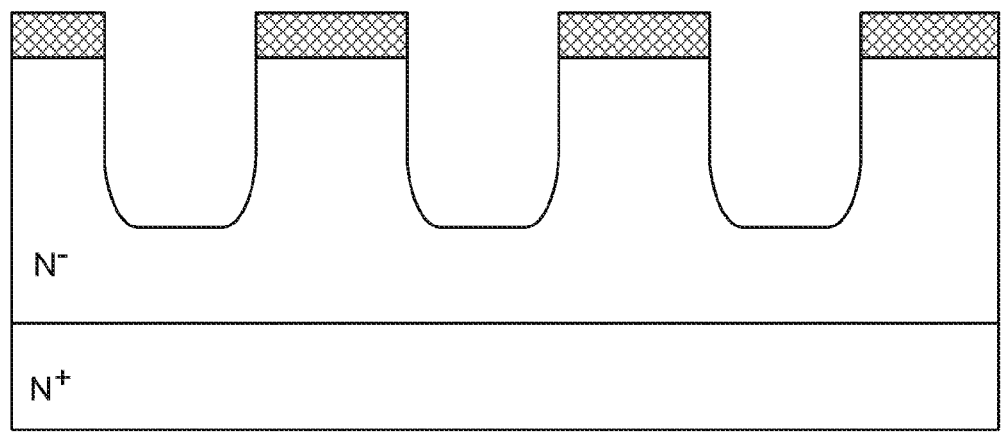
Figure 3F:
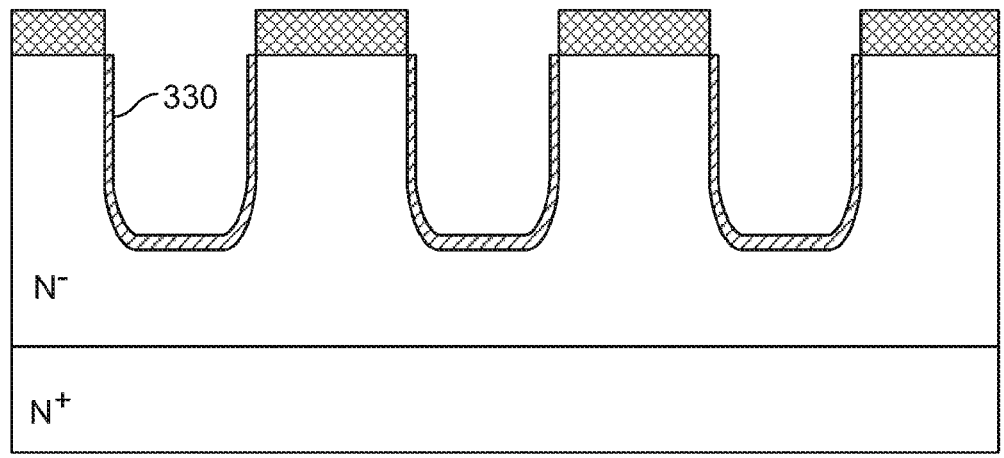
Figure 3G:
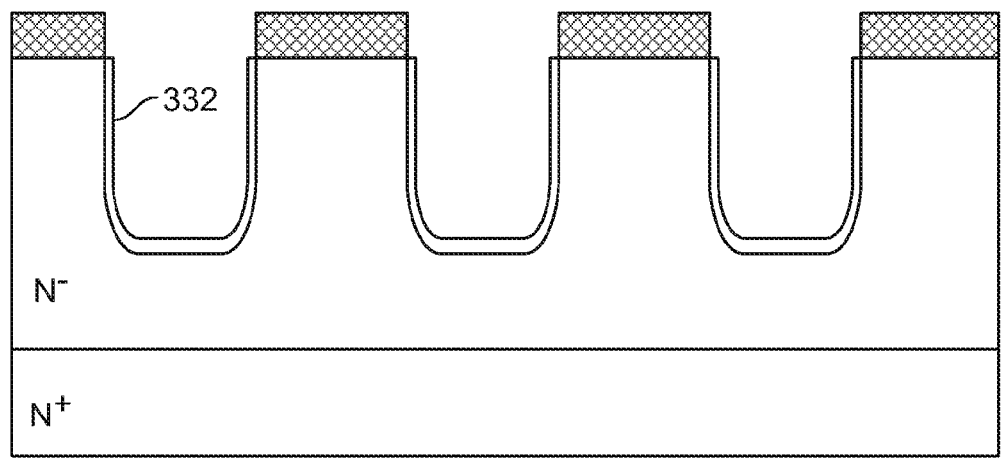

In FIG. 3E, the substrate is etched isotropically to round out the bottoms of the trenches. The trench is approximately between 0.5-2.5 μm deep and approximately between 0.2-1.5 μm wide in some embodiments; other dimensions can also be used. To provide a smooth surface for growing gate dielectric material, a sacrificial layer of SiO$_2$ 330 is grown in the trenches. This layer is then removed by the process of wet etching. In FIG. 3G, a layer of SiO$_2$ 332 is grown thermally in the trenches as dielectric material.

Figure 3H:
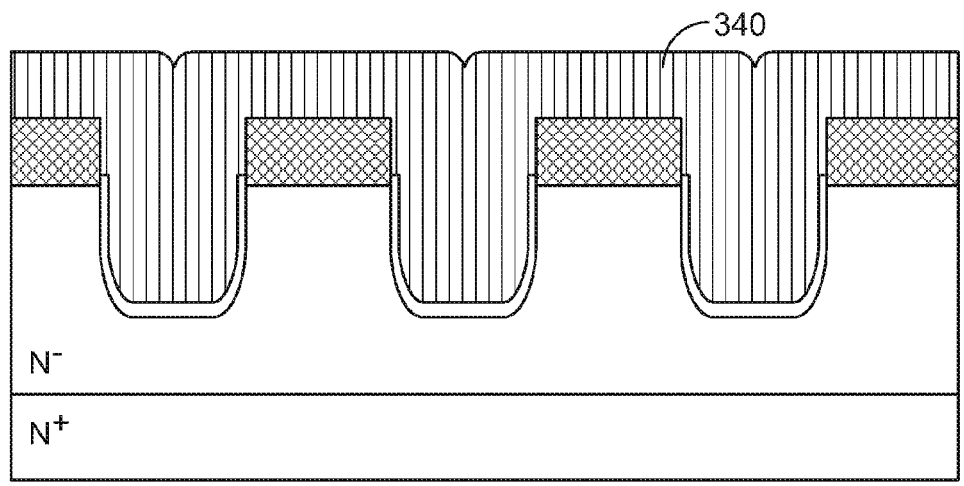
Figure 3I:
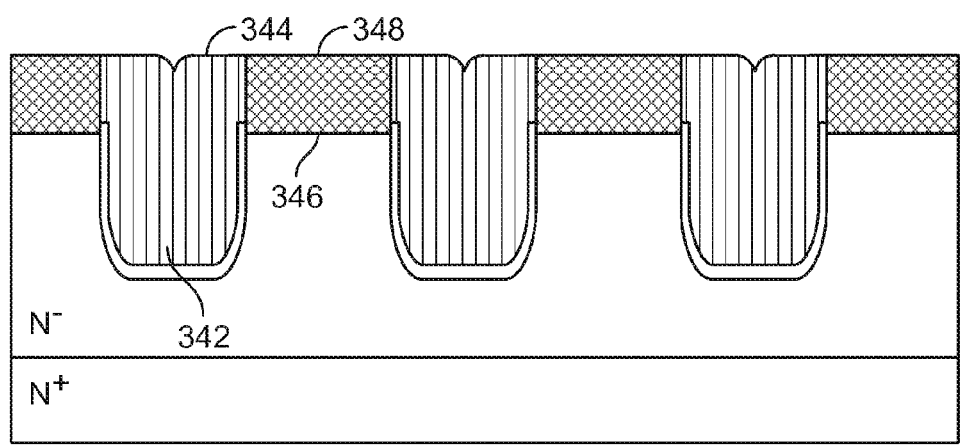
Figure 3J:
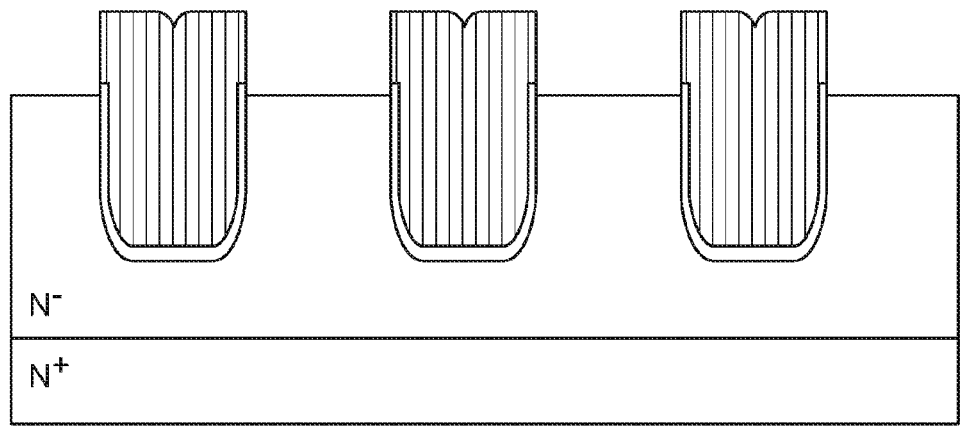

In FIG. 3H, poly 340 is deposited to fill up the trenches. In this case, the poly is doped to obtain the appropriate gate resistance. In some embodiments, doping takes place as the poly layer is deposited (in situ). In some embodiments, the poly is doped after the deposition. In FIG. 3I, the poly layer on top of the SiO$_2$ is etched back to form gates such as 342. At this point, top surface 344 of the gate is still recessed relative to top surface 348 of the SiO$_2$; however, top surface 344 of the gate may be higher than top layer 346 of the silicon, depending on the thickness of hard mask layer 310. In some embodiments, no mask is used in poly etch back. In some embodiments, a mask is used in poly etch back to eliminate the use of an additional mask in the following body implanting process. In FIG. 3J, the SiO$_2$ hard mask is removed. In some embodiments, dry etch is used for hard mask removal. The etching process stops when the top silicon surface is encountered, leaving the poly gate extending beyond the substrate surface where source and body dopants will be implanted. In some embodiments, the gate extends beyond the substrate surface by approximately between 300 Å to 20,000 Å. Other values can also be used. A SiO$_2$ hard mask is used in these embodiments since it provides the desired amount of gate extension beyond the Si surface in a controllable fashion. A screen oxide may then be grown across the wafer. The above processing steps may be simplified for fabricating devices with recessed gate poly. For example, in some embodiments a photoresist mask or a very thin SiO$_2$ hard mask is used during trench formation, and thus the resulting gate poly does not extend beyond the Si surface.

Figure 3K:
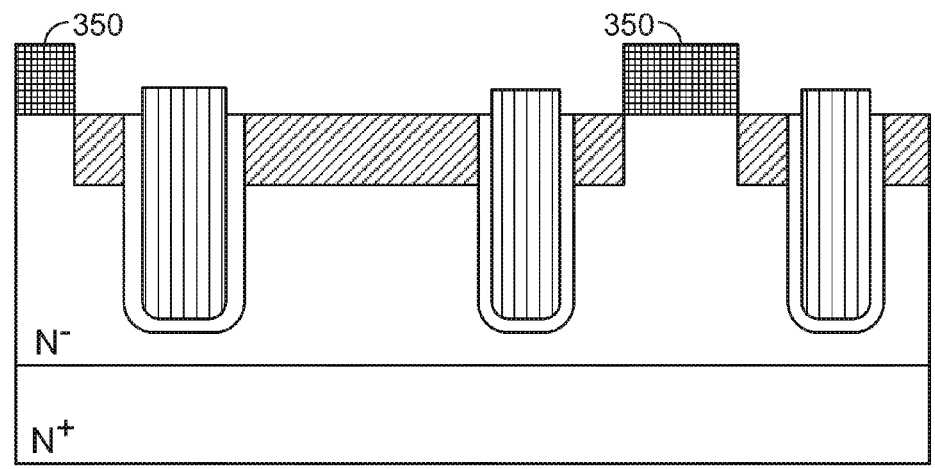
Figure 3L:
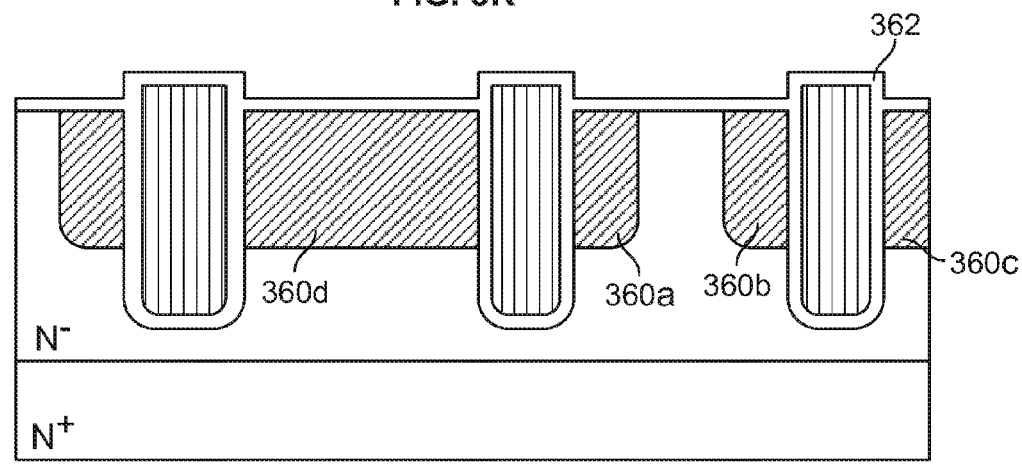
Figure 3M:
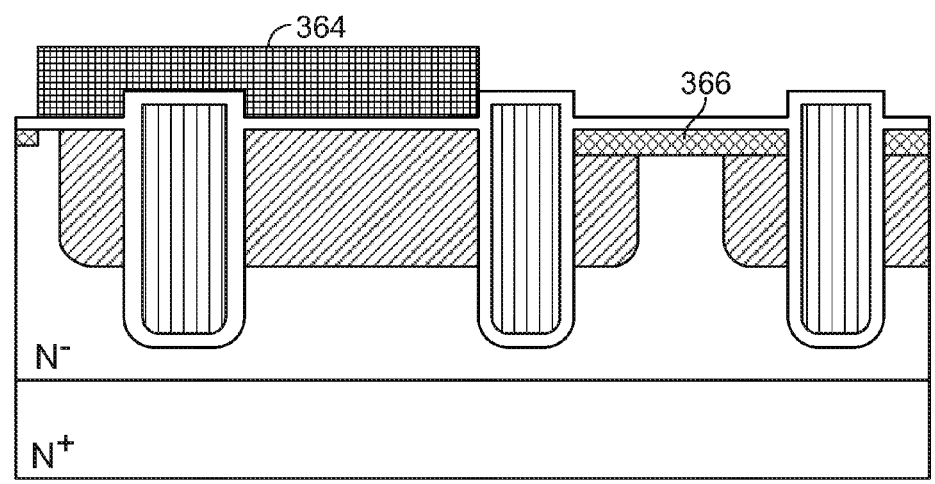

FIGS. 3K-3N illustrate the formation of the source and the body. In FIG. 3K, a photoresist layer 350 is patterned on the body surface using a body mask. The patterned photoresist layer is referred to as body block since the photoresist blocks dopants from being implanted in the masked regions. The unmasked regions are implanted with body dopants. Dopants such as Boron ions are implanted. In FIG. 3L, the photoresist is removed and the wafer is heated to thermally diffuse the implanted body dopants via a process sometimes referred to as body drive. Body regions 360a-d are formed. In some embodiments, the energy used for implanting the body dopants is approximately between 30-600 keV, the dose is approximately between 2e12-4e13 ions/cm$^2$, and the resulting final body depth is approximately between 0.3-2.4 μm. Different depths can be achieved by varying factors including the implant energy, dose and diffusion temperature. An oxide layer 362 is formed during the diffusion process.

Figure 3N:
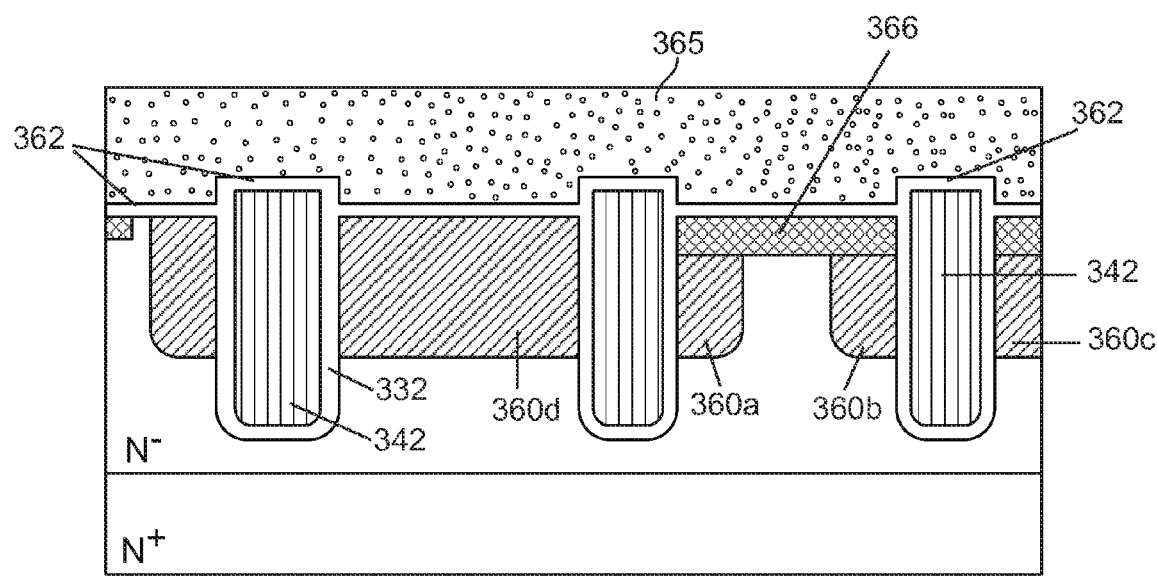
Figure 4A:
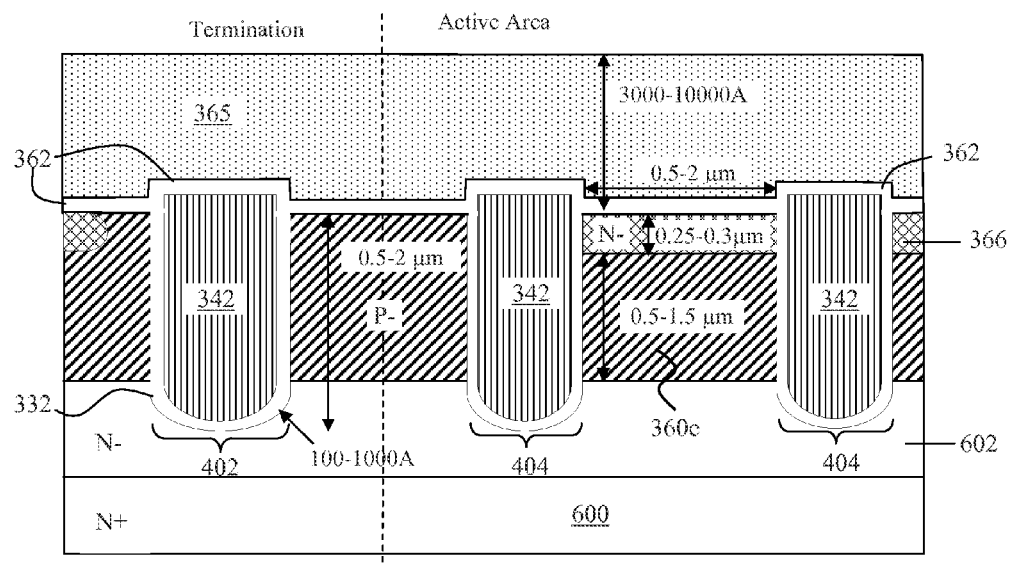
FIG. 4A depicts a cross-sectional view of a slight variation of the device of FIG. 3N due to a slight process variation from that of application Ser. No. 12/317,629.

FIG. 4A depicts a cross-sectional view of, for the purpose of the present invention, a slight variation of the device of FIG. 3N due to a slight process variation from that of application Ser. No. 12/317,629. To those skilled in the art, the slight process variation simply amounts to the omission of a step of, as illustrated in FIG. 3K, patterning a photoresist layer 350 on the body surface using a body mask. As a result, FIG. 4A shows a single body region 360e implanted with body dopants at the top portion of the epitaxial layer 602 supported by the substrate 600 and the source dopants 366 implanted at the top portion of the body implant 360e surrounding the active gate trenches 404 in the active area.

Figure 4B:
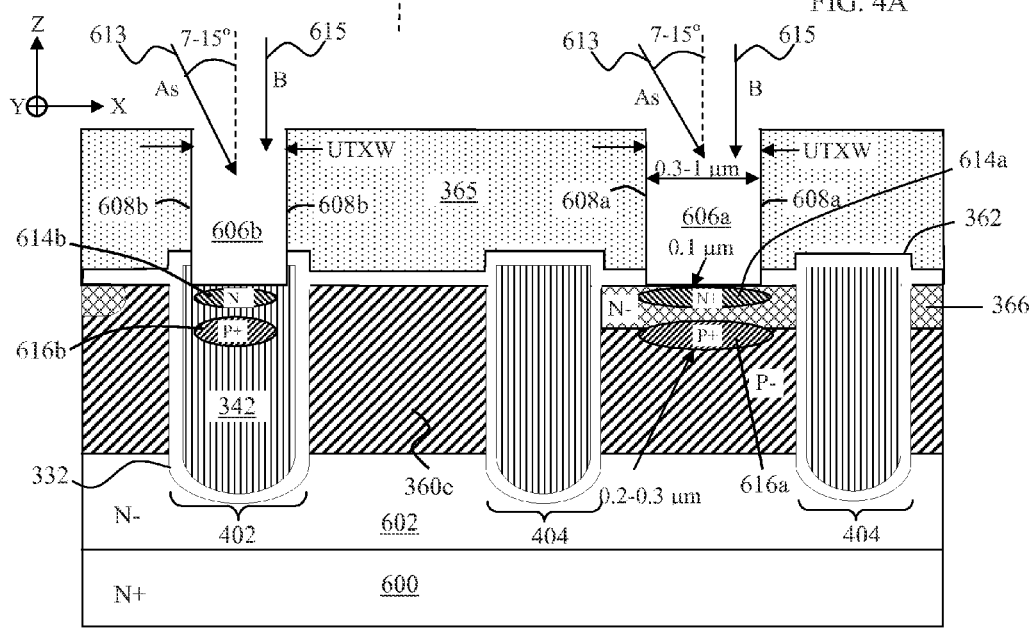
FIGS. 4B-4I are device cross-sectional views, following FIG. 4A, illustrating in detail an embodiment fabrication process under the present invention for fabricating a MOSFET device.

In FIG. 4B upper trench extension (UTX) 606a and UTX 606b are opened up, through the dielectric region 365 and the oxide layer 362 (UTX 606a) and also through a top portion of the gate runner 342 in the gate runner trench 402 (UTX 606b), with a correspondingly masked anisotropic etching step. The gate runner is located in a periphery area or termination area of MOSFET chip to provide electrical connection to each insulated trench gate in active area of MOSFET chip therefore no source implants is provided around gate runner trench 402. The resulting vertical side walls 608a and 608b thus define an upper trench extension width (UTXW). The width of UTX 606a is less than the width of mesa defined by adjacent active trenches 404 and the width of UTX 606b is less than the width of gate runner 342. Next, lower heavily-doped (P+) embedded body implant islands (EBII) 616a, 616b and upper heavily-doped (N+) embedded source implant islands (ESII) 614a, 614b are successively implanted through the UTX 606a, 606b with:

The ESII 614a embedded in the source implant 366 and horizontally reaching at least the side walls 608a of the UTX 606a. The ESII 614b embedded at the top portion of the gate runner 342 disposed in the gate runner trench 402 and horizontally reaching at least the side walls 608b of the UTX 606b.

The EBII 616a embedded in the body region 360e and horizontally also reaching at least the side walls 608a of the UTX 606a. The EBII 616b embedded also at the top portion of the gate runner 342 of the gate runner trench 402, beneath the ESII 614b and horizontally also reaching at least the side walls 608b of the UTX 606b.

As illustrated with beam 613 of arsenic (As) ions for implanting the upper ESII 614a, 614b and beam 615 of boron (B) ions for implanting the lower ESII 616a, 616b, while the beam 615 for implanting lower ESII 616a, 616b can simply be aimed vertically (parallel to Z-axis) at the device in progress the beam 613 for implanting upper ESII 614a, 614b should be tilted at a planetary angle within a range of about 7 degrees to about 15 degrees from the Z-axis to insure that the ESII 614a, 614b horizontally reaching beyond the side walls 608a of the UTX 606a. As a more specific embodiment the thicknesses (Z-direction) of EBII 616a, 616b can be from about 0.2 micron to about 0.3 micron while those of ESII 614a, 614b can be around 0.1 micron. The various implanted islands 616a, 616b, 614a, 614b can then be activated with, for example, a rapid thermal process (RTP) at 900 deg C. to 1050 deg C. for 20 sec to 30 sec.

Figure 4C:
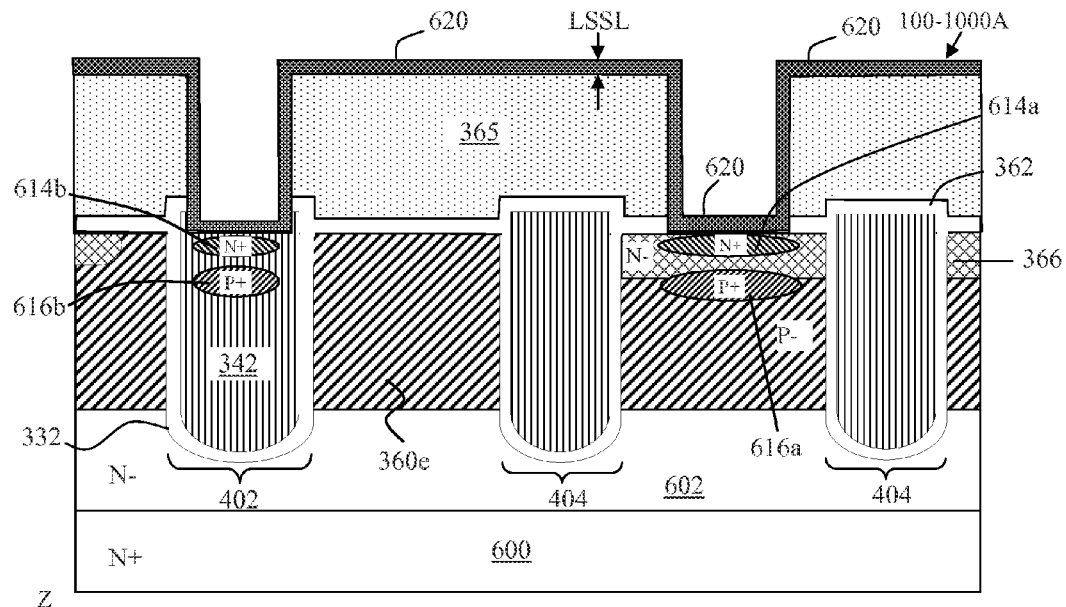
Figure 4D:
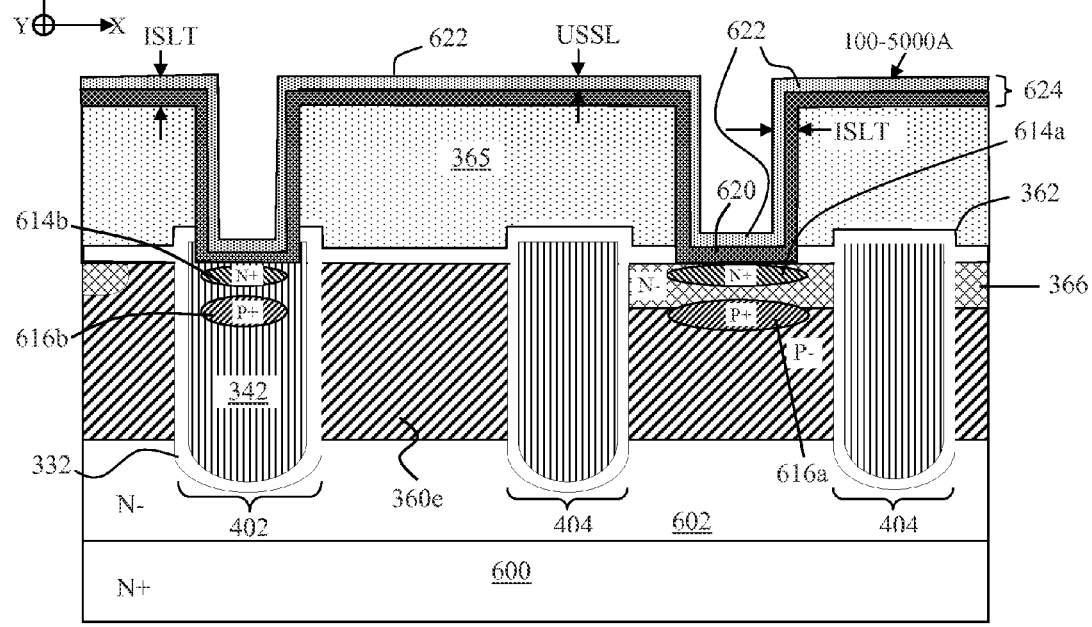

FIG. 4C to FIG. 4D illustrate the formation of an interim spacer layer (ISL) 624 of thickness ISLT covering the top and the UTX 606a, 606b within the dielectric region 365. In FIG. 4C a lower spacer sub-layer (LSSL) 620 is deposited covering the top and the UTX 606a, 606b within the dielectric region 365. In FIG. 4D an upper spacer sub-layer (USSL) 622 is deposited covering the LSSL 620 such that the total thickness of LSSL and USSL equal to the desired ISLT. In a more particular embodiment, the LSSL 620 can be made of silicon nitride with thickness from about 0.01 micron to about 0.1 micron. Correspondingly, the USSL 622 can be made of silicon oxide with thickness from about 0.01 micron to about 0.2 micron.

Figure 4E:
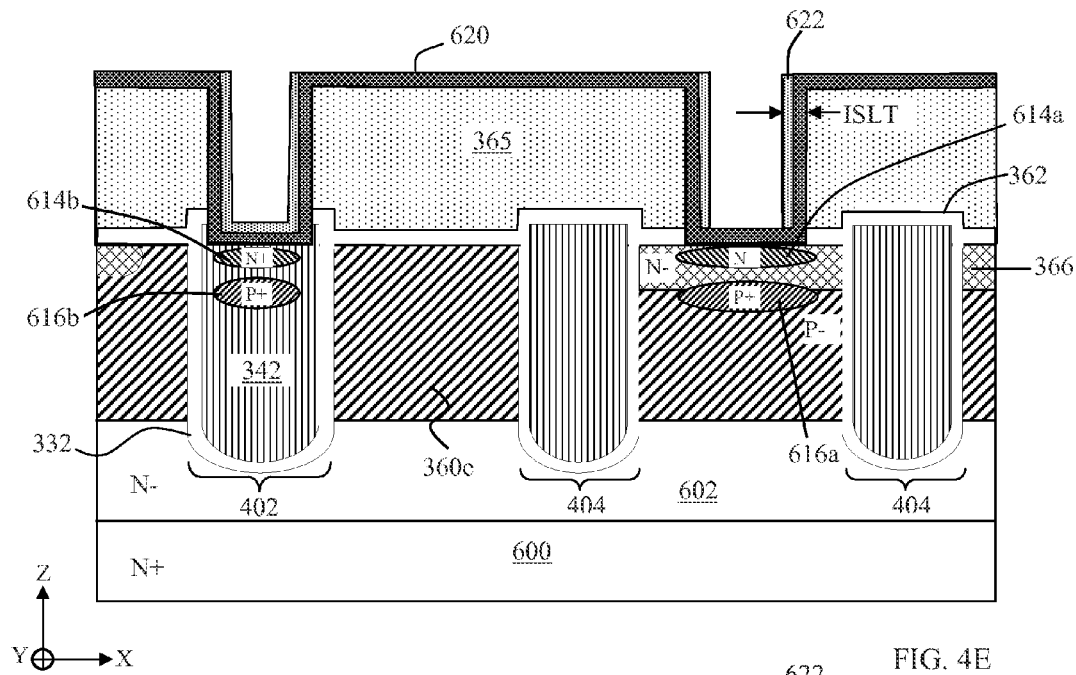
Figure 4F:
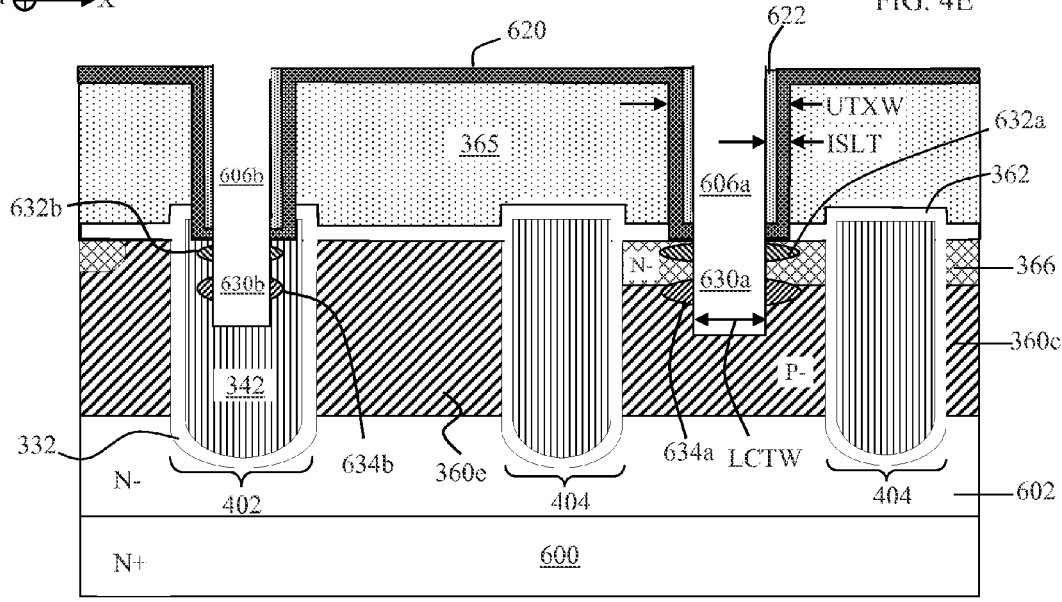
Figure 4G:
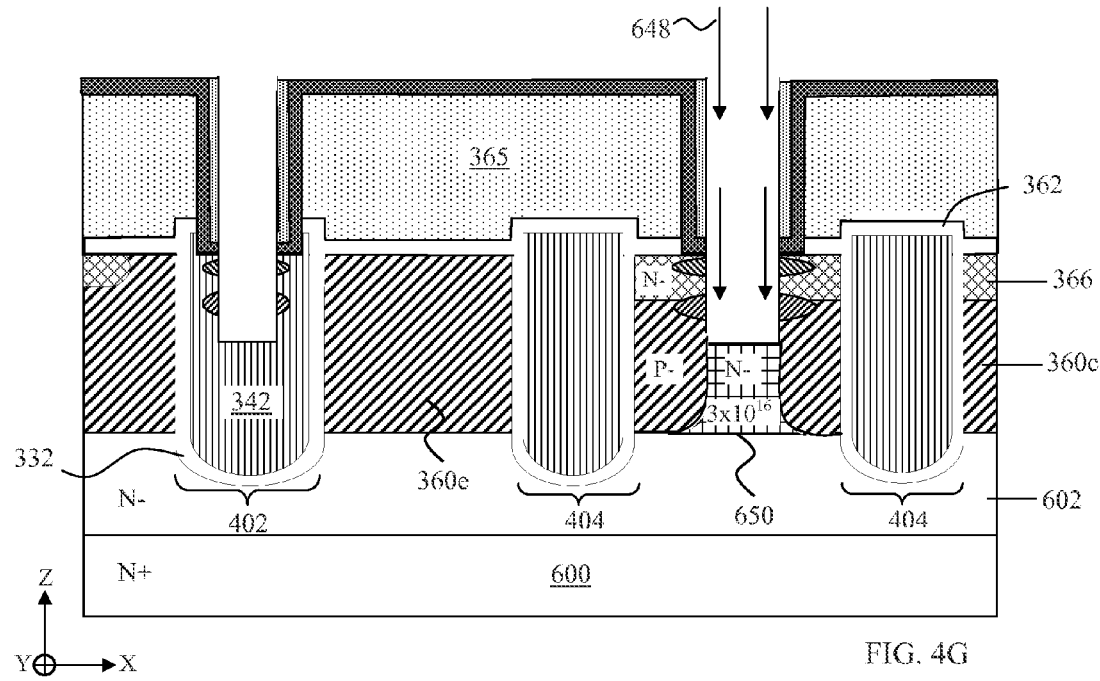

As shown in FIG. 4E to FIG. 4G, anisotropicaletching is carried out through the UTX 606a, through the bottom of the ISL 624, the source region 366 and at least part of the body region 360e while laterally limited by the ISL 624 to form a lower source/body contact trench 630a, and through UTX 606b, through the bottom of the ISL 624 and the top portion of the gate runner 342 disposed inside the gate runner trench 402 to form lower gate contact trench 630b of lower contact trench width LCTW=UTXW−2*ISLT. FIG. 4E illustrates the result of anisotropical dip etching, for example a wet dip etching for a few seconds, to remove all horizontal portions of the USSL 622 leaving its vertical side walls inside the UTX 606a, 606b essentially intact. Next, FIG. 4F illustrates the result of anisotropical dry etching, while laterally limited by the side walls of ISL 624 at the UTX 606a, through the LSSL 620 at the bottom of ISL 624, the source region 366 and at least part of the body region 360e to form lower source/body contact trench 630a and through the LSSL 620 at the bottom of ISL 624 at the UTX 606b, through the top portion of the gate runner 342 of the gate runner trench 402 to form lower gate contact trench 630b. As a result, the lower contact trench 630a, 630b are opened up. For those skilled in the art, in the active area, a thus formed Kelvin-contact source 632a (N+) together with the source region 366 (N−) form a Kelvin-contact source electrode with an exposed vertical source-contact surface. At the same time, a thus formed Kelvin-contact body 634a (P+) together with the body region 360e (P−) form a Kelvin-contact body electrode with an exposed vertical body-contact surface. Similarly, in the termination area, Kelvin-contacts 632b and 634b are formed at the gate contact electrode.

Figure 4H:
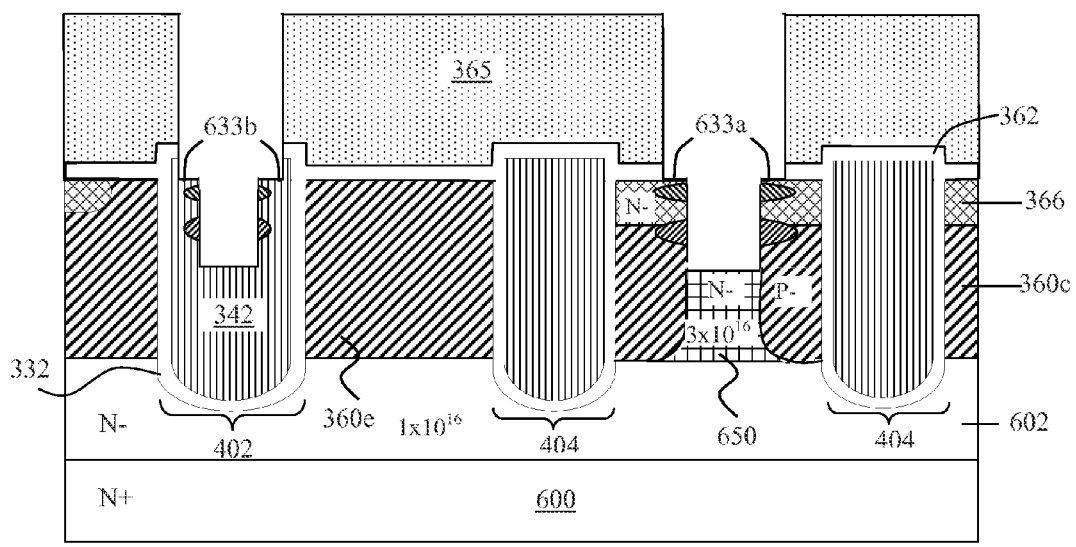
Figure 4I:
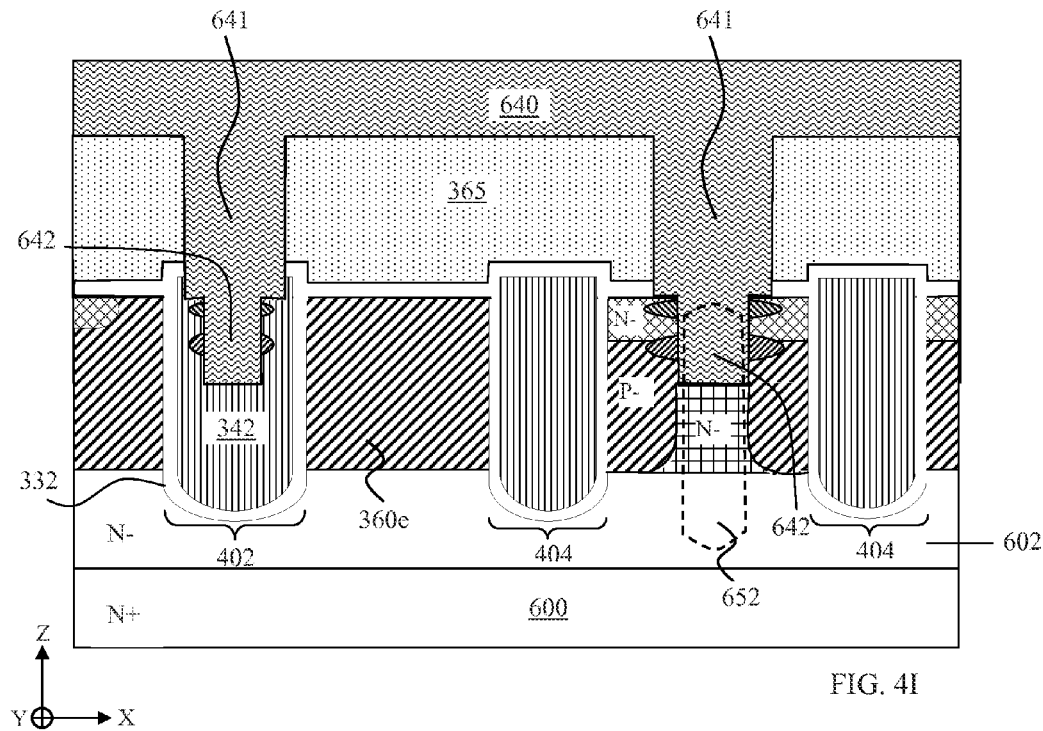

FIG. 4G to FIG. 4I illustrate an additional improvement over the device structure of FIG. 4F. In FIG. 4G an N-epitaxial enhancement portion 650 can be implanted through the UTX 606a and LCT 630a, while the UTX 606b and LCT 630b are blocked from the implantation (not shown), via an implant beam 648, inside the epitaxial region 602 and below the LCT 630a. As a typical example, the dopant of epitaxial enhancement portion 650 can be phosphorous with a dopant concentration around $3\times10^{16}/cm^3$.

In FIG. 4H the remaining layers of the ISL 624 are removed through isotropic etching. Notice that this reveals an added exposed top contact surface area 633a, with the shape of a planar ledge located parallel to X-Y plane and directly atop a portion of the Kelvin-contact source 632a (N+). The top contact surface area 633a are substantially coplanar to the bottom of oxide layer 362 covering the source region 366. As an important benefit of the present invention, this added exposed top contact surface area 633a will cause a correspondingly lowered source Kelvin contact impedance. While not as pronounced, the above formed Kelvin-contact body electrode would lower the body Kelvin contact impedance of the MOSFET device as well. For those skilled in the art, excessively high source Kelvin contact impedance and/or body Kelvin contact impedance can turn on a parasitic bipolar transistor within the MOSFET device leading to its destruction while operating in an unclamped inductive switching environment. The etching process also provides an added exposed top contact surface area 633b in gate contact trench 630b, with the shape of a planar ledge located parallel to X-Y plane substantially coplanar to the bottom of oxide layer 362 covering the source region, or the top surface of the source region 366. This added exposed top contact surface area 633b also helps to reduce the gate contact impedance. While not graphically illustrated here for those skilled in the art to avoid unnecessary obscuring details, as an embodiment of the present invention the MOSFET device can now be completed by simply forming a metal layer filling the LCT 630a, 630b, the UTX 606a, 606b and covering the dielectric region 365. As a more specific embodiment under the present invention, for a semiconductor device with a wall-to-wall pitch size less than or equal to 1.4 micron, the width of the planar ledge (along X-Y plane) can be made from about 0.02 micron to about 0.6 micron.

In FIG. 4I the MOSFET device is now completed by forming a metal layer 640 filling the LCT 630a, 630b, the UTX 606a, 606b and covering the dielectric region 365. As shown, the metal layer 640 has an upper electrode extension 641 and a lower electrode section 642 successively extending downwards and respectively through the UTX 606a, 606b and the LCT 630a, 630b. For those skilled in the art, a more detailed process of formation of the metal layer 640 includes Ti/TiN deposition and silicide formation before a final metal filling step. Also, the primary device current of the MOSFET device is understood to flow between the Kelvin-contact source 632a and the semiconductor substrate 600 under control of the gates 342. As an important aspect of the present invention, a Schottky diode 652, illustratively delineated with a dashed border, is simultaneously formed in parallel with the main MOSFET device. For those skilled in the art, the epitaxial enhancement portion 650, having the same carrier type as the epitaxial region 602, can be adjusted (through its dopant concentration and geometry) such that the breakdown voltage of Schottky diode 652 is lower than that of the main MOSFET device. In a more specific embodiment the epitaxial enhancement portion 650 has a higher carrier concentration than that of the epitaxial region 602. In this way, an otherwise undesirable, potentially damaging device breakdown through the main MOSFET device, in the absence of the Schottky diode 652, can be avoided.

FIG. 5A to FIG. 5D illustrate additional inventive embodiments of the present invention. Instead of anisotropically dry etching just partly into the body region 360e or only at a top portion of gate 342 in the gate runner trench 402 as shown in FIG. 4F, in FIG. 5A the anisotropical dry etching is carried out much further such that the resulting LCT 660a runs through the body region 360e and into the epitaxial region 602 and that the resulting LCT 660b extends in the gate 342 deeper than the bottom of body region 360e.

Figure 5A:
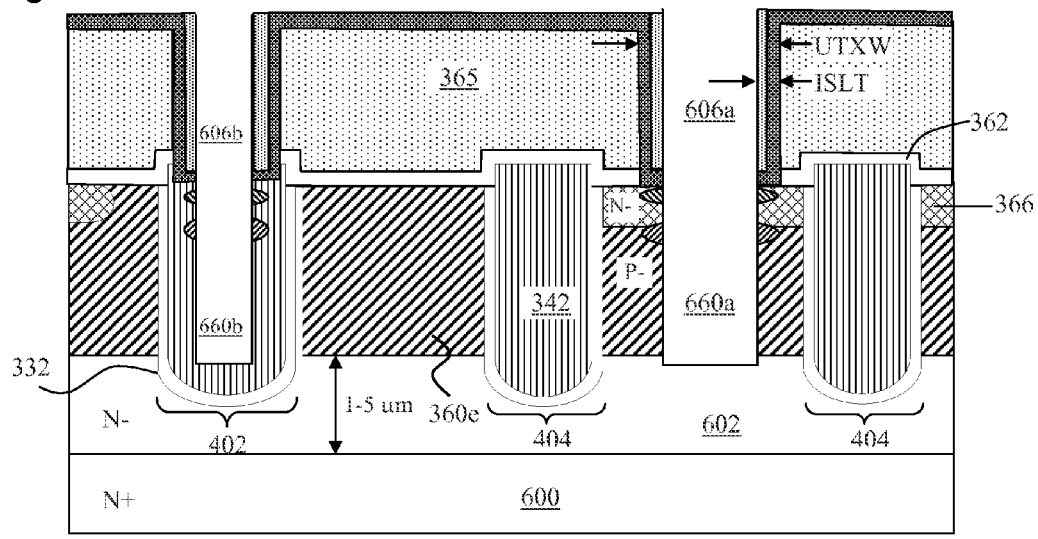
FIGS. 5A-5D are device cross-sectional views, following FIG. 4E, illustrating in detail an alternative embodiment fabrication process under the present invention for fabricating a MOSFET device.
Figure 5B:
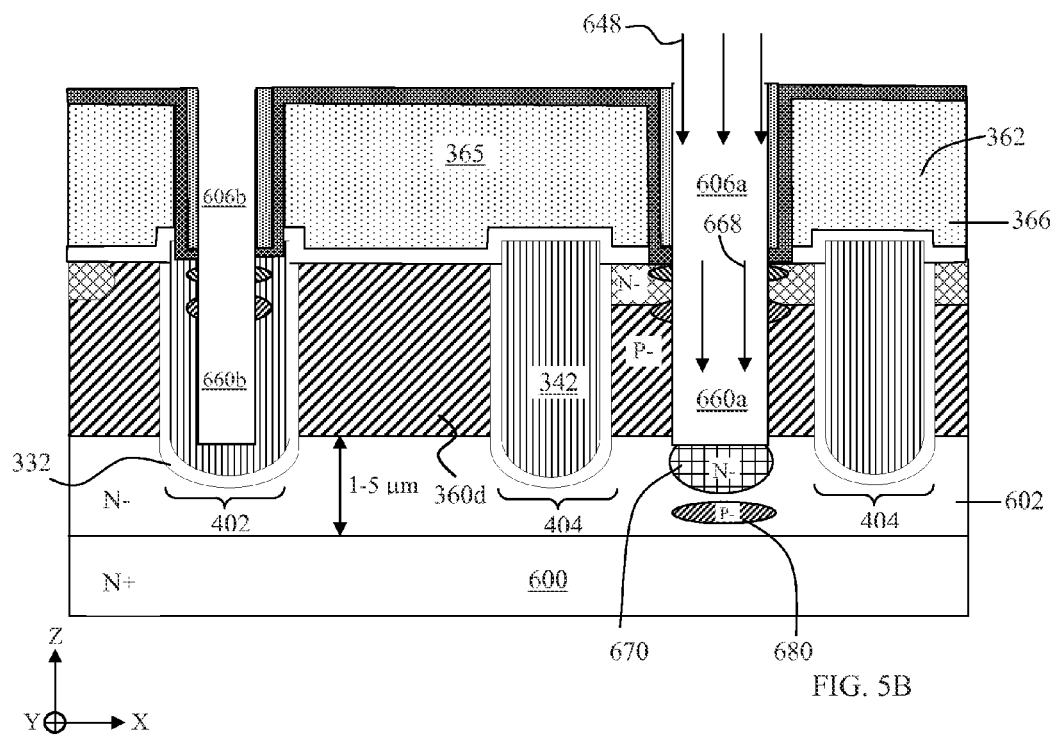

In FIG. 5B, an upper N-epitaxial enhancement portion 670 and a lower P-type IDSS-reduction implant 680 are successively implanted, through UTX 606a and LCT 660a, inside the epitaxial layer 602, while the UTX 606b and LCT 630b are blocked from the implantation (not shown), with:

The N-epitaxial enhancement portion 670 embedded in the epitaxial layer 602 and horizontally reaching at least the side walls of LCT 660a.

The P-IDSS-reduction implant 680 embedded in the epitaxial layer 602 and horizontally also reaching at least the side walls of LCT 660a. Furthermore, the IDSS-reduction implant 680 lies below and separated from the epitaxial enhancement portion 670.

Figure 5C:
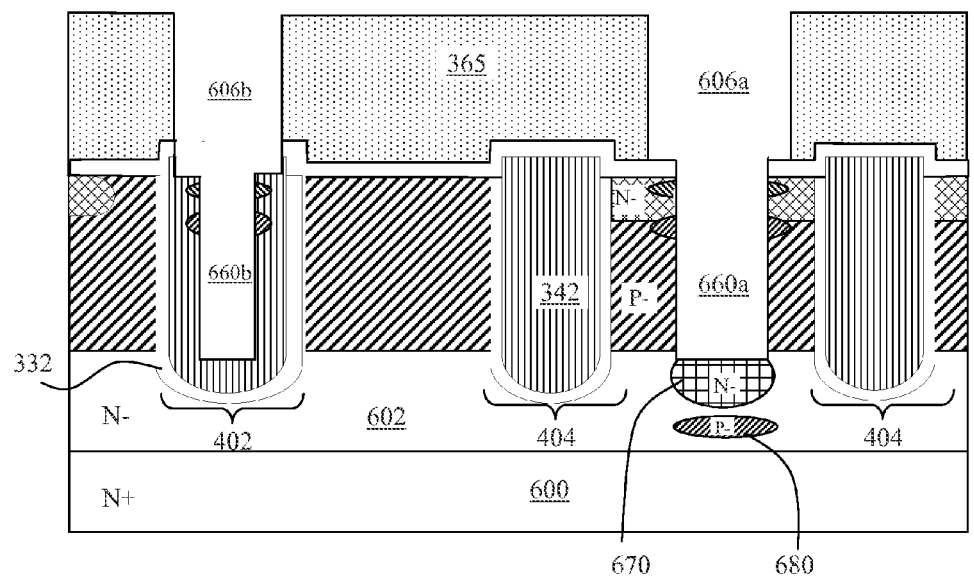

To those skilled in the art, of course, the dopant type plus other implant parameters of corresponding implant beams 668 need to be properly and successively adjusted to achieve the above desired results. The remaining layers of the ISL 624 are then removed through isotropic etching (FIG. 5C).

Figure 5D:
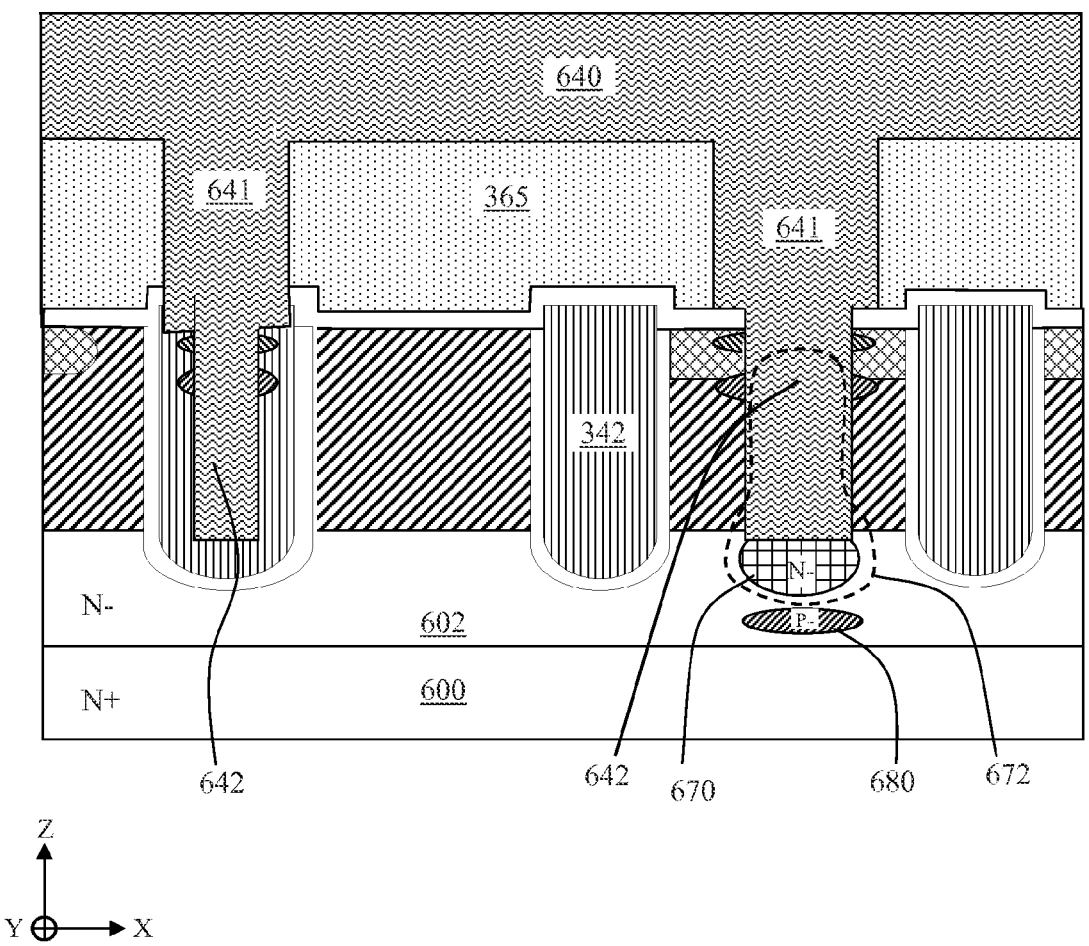

In FIG. 5D the MOSFET device is now completed by forming a metal layer 640 filling the LCT 660a, 660b, the UTX 606a, 606b and covering the dielectric region 365. As shown, the metal layer 640 has an upper electrode extension 641 and a lower electrode section 642 successively extending downwards and respectively through the UTX 606a, 606b and the LCT 660a, 660b. As an important aspect of the present invention, a Schottky diode 672, illustratively delineated with a dashed border, is simultaneously formed in parallel with the main MOSFET device. Similar to the epitaxial enhancement portion 650 described under FIG. 4H and FIG. 4I, the epitaxial enhancement portion 670, having the same carrier type as the epitaxial region 602, can be adjusted (through its dopant concentration and geometry) such that the breakdown voltage of Schottky diode 672 is lower than that of the main MOSFET device. In a more specific embodiment the epitaxial enhancement portion 670 has a higher carrier concentration than that of the epitaxial region 602. In this way, an otherwise undesirable, potentially damaging device breakdown through the main MOSFET device, in the absence of the Schottky diode 672, can be avoided. For those skilled in the art, on the other hand, the P-IDSS-reduction implant 680, having an opposite carrier type as the epitaxial region 602, acts to advantageously reduce the leakage current IDSS of the semiconductor device.

While the description above contains many specificities, these specificities should not be construed as accordingly limiting the scope of the present invention but as merely providing illustrations of numerous presently preferred embodiments of this invention. Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. For example, while the epitaxial region 602 and the epitaxial enhancement portion 670 are both illustrated in FIG. 5D as being N-type, they could alternatively be made into P-type accompanied by proper reversal of conductivity type of the other semiconductor device zones. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

We claim:

1. An Integrated MOSFET-Schottky Diode semiconductor device, expressed in an X-Y-Z Cartesian coordinate system with the X-Y plane parallel to its major semiconductor chip plane, comprising:
   a drain lying parallel to X-Y plane with an epitaxial layer overlaying the drain;
   a Kelvin-contact body disposed in the epitaxial layer with a Kelvin-contact source embedded in the Kelvin-contact body wherein the Kelvin-contact source conductivity type is opposite to that of the Kelvin-contact body conductivity type;
   a gate trench extending parallel to Z-axis into the epitaxial layer with a gate disposed in the gate trench;
   a lower contact trench extending parallel to Z-axis through the Kelvin-contact source and at least part of the Kelvin-contact body defining respectively an exposed vertical source-contact surface and an exposed vertical body-contact surface thereon;
   a dielectric material layer located atop the Kelvin-contact source and the gate trench; and
   a metal layer located atop the dielectric material layer wherein the two layers are patterned such that:
   a) the dielectric material layer has an upper trench extension located atop the lower contact trench;
   b) the X-Y cross sectional size of the upper trench extension is larger than that of the lower contact trench by an amount whereby defining a planar ledge located parallel to X-Y plane and in direct contact with a semiconductor material of conductivity type same as the Kelvin-contact source conductivity type;
   c) the metal layer has a top metal plane, substantially parallel to X-Y plane, with an upper electrode extension and a lower electrode section successively extending downwards and respectively through the upper trench extension and the lower contact trench; and
   d) a correspondingly formed MOSFET device, with its primary device current flowing between the Kelvin-contact source and the drain under control of the gate, exhibits a lowered body Kelvin contact impedance and, owing to an added exposed top contact surface area of the Kelvin-contact source from the planar ledge, a source Kelvin contact impedance that is lower than an otherwise MOSFET device without said planar ledge; and
   e) the lower electrode section and the epitaxial layer form a corresponding Schottky diode in parallel with the MOSFET device; and
   a gate runner trench extending parallel to Z-axis into the epitaxial layer with a gate runner disposed in the gate runner trench, a lower gate contact electrode section formed on a top portion of the gate runner, and a Kelvin-contact located in the gate runner and adjacent to a side of the lower gate contact electrode section.

2. The Integrated MOSFET-Schottky Diode semiconductor device of claim 1 wherein a heavily-doped sub-region of the Kelvin-contact source is a source contact implant located on its side adjacent to the lower electrode section while a lightly-doped sub-region of the Kelvin-contact source is located on its side away from the lower electrode section.

3. The Integrated MOSFET-Schottky Diode semiconductor device of claim 1 wherein the Kelvin-contact body has opposite carrier type as the epitaxial layer and a heavily-doped sub-region of the Kelvin-contact body is a body contact implant located on its side adjacent to the lower electrode section while a lightly-doped sub-region of the Kelvin-contact body is located on its side away from the lower electrode section.

4. The Integrated MOSFET-Schottky Diode semiconductor device of claim 1 wherein the epitaxial layer further comprising an epitaxial enhancement portion, having the same carrier type as the epitaxial layer and implanted below the lower electrode section, wherein the geometry and dopant concentration of the epitaxial enhancement portion are adjusted such that the breakdown voltage of said Schottky diode is lower than that of said MOSFET device whereby avoiding an otherwise undesirable, potentially damaging device breakdown through said MOSFET device in the absence of the Schottky diode.

5. The Integrated MOSFET-Schottky Diode semiconductor device of claim 4 wherein the epitaxial enhancement portion has a higher carrier concentration than the epitaxial layer.

6. The Integrated MOSFET-Schottky Diode semiconductor device of claim 4 wherein the lower contact trench extending parallel to Z-axis through the Kelvin-contact source and the Kelvin-contact body into the epitaxial layer.

7. The Integrated MOSFET-Schottky Diode semiconductor device of claim 6 wherein the epitaxial layer further comprising an IDSS-reduction implant, having an opposite carrier type as the epitaxial layer and implanted below the epitaxial enhancement portion, for reducing the leakage current IDSS of the semiconductor device.

8. The Integrated MOSFET-Schottky Diode semiconductor device of claim 1, wherein the semiconductor device has a wall-to-wall pitch size less than or equal to 1.4 micron.

9. The Integrated MOSFET-Schottky Diode semiconductor device of claim 1 wherein the width of the planar ledge (along X-Y plane) is from about 0.02 micron to about 0.6 micron.

10. The Integrated MOSFET-Schottky Diode semiconductor device of claim 4, wherein the epitaxial layer and the epitaxial enhancement portion are N-type.

* * * * *